US007176119B2

(12) United States Patent
Gambino et al.

(10) Patent No.: US 7,176,119 B2
(45) Date of Patent: Feb. 13, 2007

(54) METHOD OF FABRICATING COPPER DAMASCENE AND DUAL DAMASCENE INTERCONNECT WIRING

(75) Inventors: Jeffrey P. Gambino, Westford, VT (US); William Hill, Westford, VT (US); Kenneth F. McAvey, Jr., Winooski, VT (US); Thomas L. McDevitt, Underhill, VT (US); Anthony K. Stamper, Williston, VT (US); Arthur C. Winslow, Essex Junction, VT (US); Robert Zwonik, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 157 days.

(21) Appl. No.: 10/711,456

(22) Filed: Sep. 20, 2004

(65) Prior Publication Data

US 2006/0063373 A1  Mar. 23, 2006

(51) Int. Cl.
    *H01L 21/4763* (2006.01)
(52) U.S. Cl. ............... 438/622; 438/618; 438/620; 438/E21.304
(58) Field of Classification Search ......... 438/618–622
    See application file for complete search history.

(56) References Cited

U.S. PATENT DOCUMENTS

| 6,355,563 | B1 | 3/2002 | Cha et al. | |
|---|---|---|---|---|
| 6,414,377 | B1 | 7/2002 | Cohen et al. | |
| 6,521,537 | B1 | 2/2003 | Laursen | |
| 2003/0134499 | A1 | 7/2003 | Chen et al. | |
| 2003/0219996 | A1 | 11/2003 | Lee | |
| 2004/0061229 | A1 | 4/2004 | Moslehi | |
| 2004/0187304 | A1* | 9/2004 | Chen et al. | .......... 29/830 |
| 2004/0214425 | A1* | 10/2004 | Lin et al. | .......... 438/629 |
| 2005/0242430 | A1* | 11/2005 | Lin et al. | .......... 257/734 |

* cited by examiner

*Primary Examiner*—Dung A. Le
(74) *Attorney, Agent, or Firm*—Schmeiser, Olsen & Watts; William D. Sabo

(57) ABSTRACT

An integrated circuit and a method of manufacturing the integrated circuit, the method including: (a) providing a substrate; (b) forming a copper diffusion barrier layer on the substrate; (c) forming a dielectric layer on a top surface of the copper diffusion barrier layer; (d) forming a copper damascene or dual damascene wire in the dielectric layer, a top surface of the copper damascene or dual damascene wire coplanar with a top surface of the dielectric layer; (e) forming a first capping layer on the top surface of the wire and the top surface of the dielectric layer; (f) after step (e) performing one or more characterization procedures in relation to said integrated circuit; and (g) after step (e) forming a second capping layer on a top surface of the first capping layer.

25 Claims, 7 Drawing Sheets

METHOD OF FABRICATING COPPER DAMASCENE AND DUAL DAMASCENE INTERCONNECT WIRING

FIELD OF THE INVENTION

The present invention relates to the field of integrated circuit fabrication; more specifically, it relates to method of fabricating copper damascene and dual damascene wires.

BACKGROUND OF THE INVENTION

Semiconductor manufacturers must contend with continually decreasing device sizes, wire widths and wire thicknesses and power consumption as well as increasing device density, wire density and operating frequencies. These requirements have led the semiconductor industry to utilize copper wiring in place of older wire materials, for example, those based on aluminum and aluminum alloys. For example, aluminum has problems associated with heat dissipation and electro-migration. Copper, which has a lower resistivity and greater electro-migration lifetime eliminates many of the problems associated with aluminum and is more suitable for use in low-power, low-voltage and high speed applications. However, there are difficulties with fabricating copper interconnects because copper is more reactive than aluminum and can diffuse through many dielectric materials complicating the fabrication process of copper wiring. Therefore, there is a need for a method of fabricating copper interconnect wiring that reduces the risk of problems related to the reactivity of copper and the diffusion of copper while still providing a cost effective manufacturable process.

SUMMARY OF THE INVENTION

A first aspect of the present invention is a method of manufacturing an interconnect, comprising: (a) providing a substrate; (b) forming a dielectric layer on the substrate; (c) forming a wire in the dielectric layer, a top surface of the wire coplanar with a top surface of the dielectric layer; (d) forming a first capping layer on the top surface of the wire and the top surface of the dielectric layer, the first capping layer thin enough to allow penetration of the first capping layer by a point of a conductive probe tip in order to make electrical contact to the wire; and (e) after step (d) forming a second capping layer on a top surface of the first capping layer.

A second aspect of the present invention is a method of manufacturing an integrated circuit, comprising: (a) providing a substrate; (b) forming a copper diffusion barrier layer on the substrate; (c) forming a dielectric layer on a top surface of the copper diffusion barrier layer; (d) forming a copper damascene or dual damascene wire in the dielectric layer, a top surface of the copper damascene or dual damascene wire coplanar with a top surface of the dielectric layer; (e) forming a first capping layer on the top surface of the wire and the top surface of the dielectric layer; (f) after step (e) performing one or more characterization procedures in relation to the integrated circuit; and (g) after step (f) forming a second capping layer on the top surface of the first capping layer.

A third aspect of the present invention is an integrated circuit, comprising: a copper damascene or dual damascene wire in a fluorinated silicon glass dielectric layer, a top surface of the copper damascene or dual damascene wire coplanar with a top surface of the fluorinated silicon glass dielectric layer; a first capping layer formed on the top surface of the copper damascene or dual damascene wire and the top surface of the fluorinated silicon glass dielectric layer; and a second capping layer formed on the top surface of the first capping layer, the first capping layer thin enough to allow performance of one or more characterization procedures in relation to the integrated circuit and thick enough to prevent formation, on the top surface of the copper damascene or dual damascene wire, of copper containing particles by reaction of copper in the copper damascene or dual damascene wire with fluorine in the fluorinated silicon glass dielectric layer.

A fourth aspect of the present invention is a method of manufacturing an interconnect, comprising: (a) providing a substrate; (b) forming a copper wire in a dielectric layer, the dielectric layer having a top surface; (c) exposing a copper top surface of the copper wire, the copper top surface of the copper wire coplanar with the top surface of the dielectric layer or exposing the copper top surface of the copper wire in a bottom of a trench formed in the dielectric layer; after step (c), (d) storing the substrate in a controlled environment; and after step (d), (e) performing further processing steps on the substrate.

A fifth aspect of the present invention is a method of manufacturing an interconnect, comprising: (a) providing a substrate; (b) forming a copper wire in a dielectric layer, the dielectric layer having a top surface; (c) exposing a copper top surface of the copper wire, the copper top surface of the copper wire coplanar with the top surface of the dielectric layer or exposing the copper top surface of the copper wire in a bottom of a trench formed in the dielectric layer to an ambient atmosphere for a period of time; after step (c), (d) if the period of time exceeds a predetermined period of time, performing a rework clean or a rework chemical mechanical polish; and after step (d), (e) performing further processing steps on the substrate.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

A damascene process is one in which wire trench or via openings are formed in a dielectric layer, an electrical conductor deposited on a top surface of the dielectric of sufficient thickness to fill the trenches and a chemical-mechanical-polish (CMP) process performed to remove excess conductor and make the surface of the conductor co-planer with the surface of the dielectric layer to form a damascene wires (or damascene vias).

A dual damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor is deposited on a top surface of the dielectric of sufficient thickness to fill the trenches and via opening and a CMP process performed to make the surface of the conductor in the trench co-planer with the surface the dielectric layer to form dual damascene wire and dual damascene wires having integral dual damascene vias. A dual damascene wire is thus a special case of a damascene wire. In an alternative dual damascene process sequence, the wire trenches are formed before the via openings.

In both damascene and dual damascene processes the deposited electrical conductor may include one or more thin conductive liner layers and a thicker core conductor layer.

Figure 1:
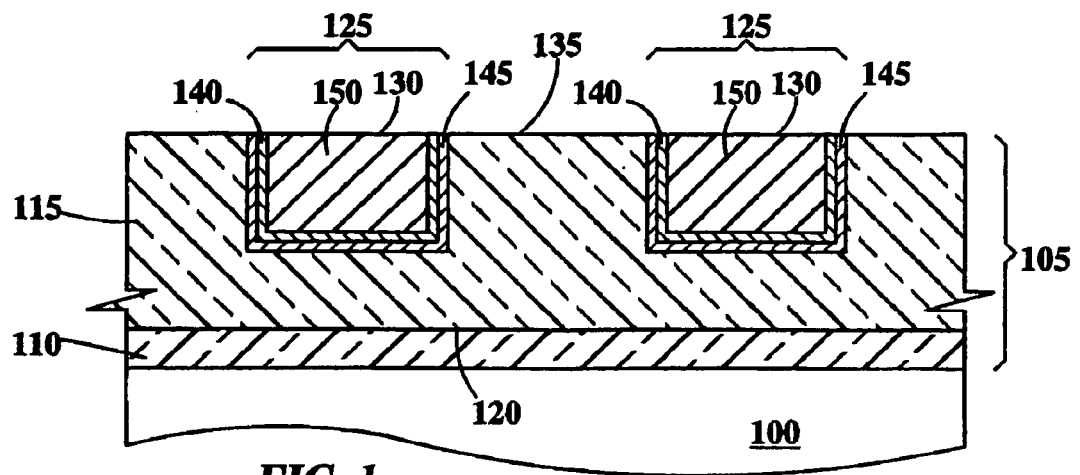
FIG. 1 is a partial cross-sectional view illustrating a typical damascene copper interconnect.

FIG. 1 is a partial cross-sectional view illustrating a typical damascene copper interconnect. In FIG. 1, formed on a substrate 100 is a wiring level 105. Wiring level 105 includes a dielectric copper diffusion barrier layer 110 and an interlevel dielectric (ILD) layer 115 formed on a top layer surface 120 of dielectric copper diffusion barrier 110. Formed in ILD layer 115 are wires 125. A dielectric copper diffusion barrier layer is defined as a layer comprising a dielectric material of sufficient thickness to block the diffusion of copper species through the layer over the expected lifetime and operating voltages and temperature of the integrated circuit chip in which it is incorporated. Top surfaces 130 of wires 125 are substantially coplanar with a top surface 135 of ILD layer 115. Wires 125 comprise an inner liner 140, an optional outer liner 145 and a copper core conductor 150. Wires 125 may be damascene or dual damascene wires. In one example, inner liner 140 comprises tantalum (Ta), outer liner 145 comprises tantalum nitride (TaN) and dielectric copper diffusion barrier 110 comprises silicon nitride ($Si_xN_y$). Of particular interest to the present invention is when ILD layer 115 comprises a dielectric which may be reactive with core conductor 150, such as fluorinated silicon oxide ($Si_xO_yF_z$) also called fluorinated silicon glass (FSG). It should be noted that wiring level 105 is exemplary of any one many wiring levels used in integrated circuits and there may be additional wiring levels in substrate 100 below wiring level 105.

Figure 2A:
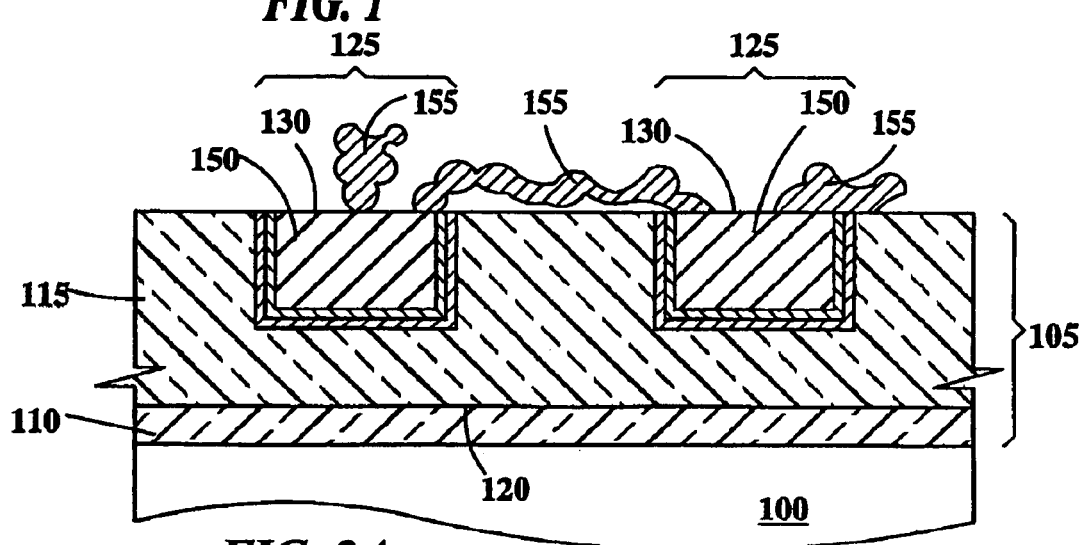
FIGS. 2A and 2B are a partial cross-sectional views illustrating a newly discovered corrosion problems associated with the exposed copper interconnect wiring of FIG. 1.
Figure 2B:
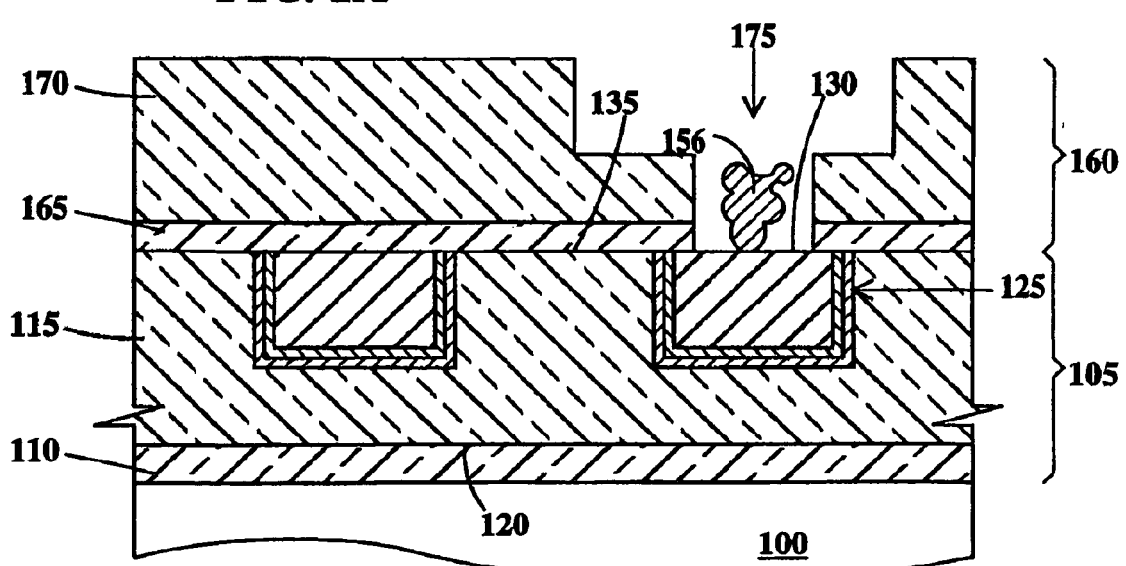

FIGS. 2A and 2B are a partial cross-sectional views illustrating a newly discovered corrosion and particulate growth problems associated with the exposed copper interconnect wiring of FIG. 1. In FIG. 2A, the structures illustrated in FIG. 1 have been allowed to sit exposed to ambient atmosphere air. It can be seen that particles 155 which have been found to comprise copper oxy-fluoride ($Cu_xO_yF_z$) have formed on the exposed copper of top surfaces 130 of wires 125 and may bridge between wires 125 as shown. Growth and nucleation of particles 155 to a size sufficient to bridge between two adjacent wires 125 is a function of time, the distance between wires 125, moisture content and temperature of the air and the fluorine content of ILD layer 115.

Exposure to ambient air comes about during the normal inline probing and testing, measurement and inspection procedures carried out during the manufacture of integrated circuits.

While $Cu_xO_yF_z$ may itself be non-conductive, subsequent processing (for example. cleaning in ammonia, hydrogen or other reducing chemical) steps prior to formation upper wiring levels, chemically reduces the $Cu_xO_yF_z$ to Cu which is conductive and may short adjacent wires 125 together.

In FIG. 2B, formed on top surface 135 of ILD layer 115 is a level 160. Level 160 includes a dielectric copper diffusion barrier layer 165 and an interlevel ILD layer 170 formed on top layer surface 120 of dielectric copper diffusion barrier 165. Formed through ILD layer 170 and dielectric copper diffusion barrier layer 165 is a wire trench/via opening 175 exposing top surface 130 of wire 125.

In FIG. 2B, the exposed top surface 130 of wire 125 has been allowed to sit exposed to ambient air. It can be seen that particles 156 have formed on the exposed copper of top surfaces 130 of wires 125. Particles 156 may be, for example, comprised of $Cu_xO_yF_x$ as described supra, or $N_xH_yF_z$. When wire trench/via opening 175 is filled with metallurgy (such as a Ta liner and copper core similar to that described supra for wire 125) particles 156 or their residue after an optional degas, plasma and/or sputter clean performed prior to liner deposition, will increase the resistance of the via and or wire formed in wire trench/via opening 175.

Exposure to ambient air in this case comes about because of normal process queuing as well as inline inspections and testing.

FIGS. 3A through 3I are partial cross-sectional views of a method of fabricating copper interconnect wires according to a first embodiment of the present invention. FIGS. 3A through 3I illustrate the present invention using a dual damascene process. The invention is equally applicable to single damascene processing where vias and studs are formed in adjacent levels to the wiring levels.

Figure 3A:
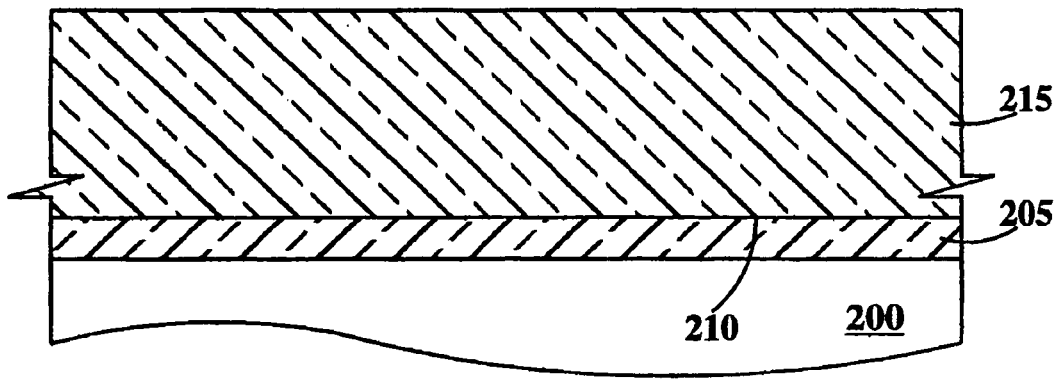
FIGS. 3A through 3I are partial cross-sectional views of a method of fabricating copper interconnect wires according to a first embodiment of the present invention.

In FIG. 3A, formed on a substrate 200 is a dielectric copper diffusion barrier 205 and formed on a top surface 210 of dielectric copper diffusion barrier 205 is an ILD layer 215. In one example dielectric copper diffusion barrier layer 205 comprises $Si_xN_y$ and is about 350 Å to about 900 Å thick. In one example, ILD layer 215 is FSG containing about 1% to about 9% fluorine by weight and is about 0.2 microns to about 6 microns thick. Formation of $Si_xN_y$ by plasma-enhanced chemical-vapor-deposition (PECVD) is well known in the art. In a first example, FSG may be formed in a PECVD or high-density plasma CVD (HDPCVD) silane based process with the introduction of a fluorine containing gas such as $SiF_4$ into the CVD chamber. In a second example, FSG may be formed in a PECVD or $O_3$ TEOS (tetraethoxysilane) based process with the introduction of a fluorine containing gas such as $SiF_4$ into the CVD chamber.

Figure 3B:
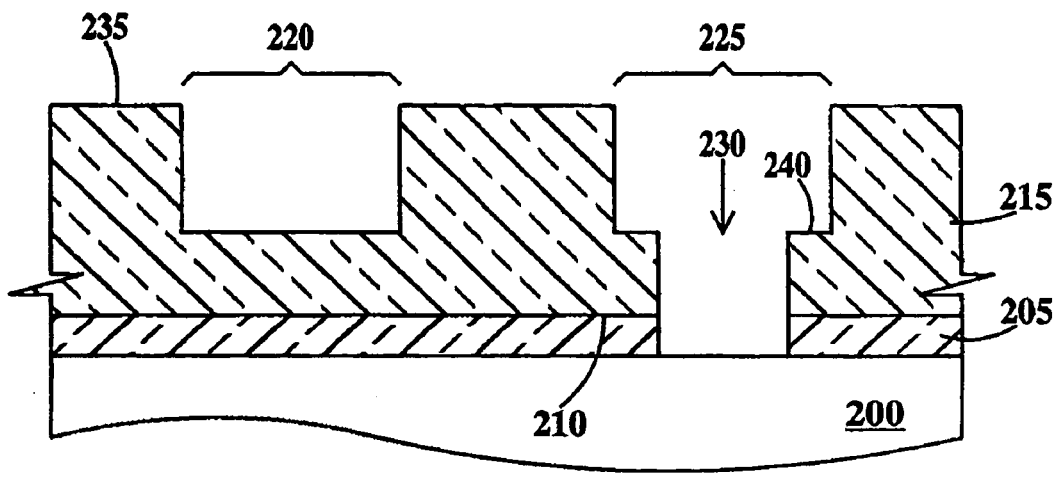

In FIG. 3B, a dual damascene wire trench 220 is formed in ILD layer 215 and a dual damascene wire trench 225 is formed in ILD layer 215 with a corresponding dual damascene via opening 230 formed in ILD layer 215 and dielectric copper diffusion barrier layer 205. Dual damascene wire trench 220, dual damascene wire trench 225 and dual damascene via 230 may be formed by one of any number of well known reactive ion etch (RIE) processes well known in the art. Dual damascene wire trenches 220 and 225 extend from a top surface 235 of ILD layer 215 part way toward dielectric copper diffusion barrier layer 205. Dual damascene via opening 230 extends from a bottom surface of dual damascene trench 225 through the entire remaining thickness of dielectric copper diffusion barrier 205 to substrate 200. Copper diffusion barrier layer 205 also acts as an RIE stop layer for ILD layer 215 etching.

Figure 3C:
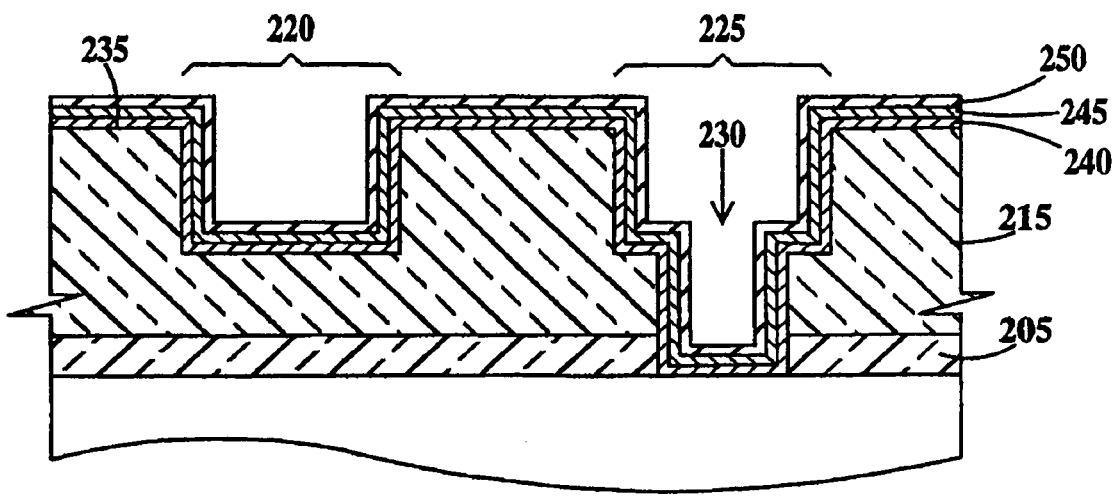

In FIG. 3C, a conformal outer liner layer 240 is deposited on top surface of ILD layer 215 and all exposed surfaces of dual damascene wire trench 220, dual damascene wire trench 225, dual damascene via opening 230 and substrate 200 in the bottom of via opening 230. A conformal inner liner layer 245 is then deposited over all exposed surfaces of outer liner layer 240. Then a conformal seed layer 250 is deposited over all exposed surfaces of inner liner layer 245. In one example, outer liner layer 240 comprises TaN and is about 50 Å to about 800 Å in thickness, inner liner layer 245 comprises Ta and is about 50 Å to about 800 Å in thickness and seed layer 250 comprises copper and is about 50 Å to about 700 Å in thickness. Alternatively outer liner layer 240, inner liner layer 245 and/or seed layer 250 may be formed by an evaporation process, an electroplating process or a sputtering process. Examples of deposition processes that may be used to form outer liner layer 240, inner liner layer 245 and seed layer 250 include but are not limited to physical vapor deposition (PVD), ionized PVD (IPVD), self ionized plasma (SIP) deposition, hollow cathode magnetron (HCM) deposition, CVD and atomic layer deposition (ALD).

Figure 3D:
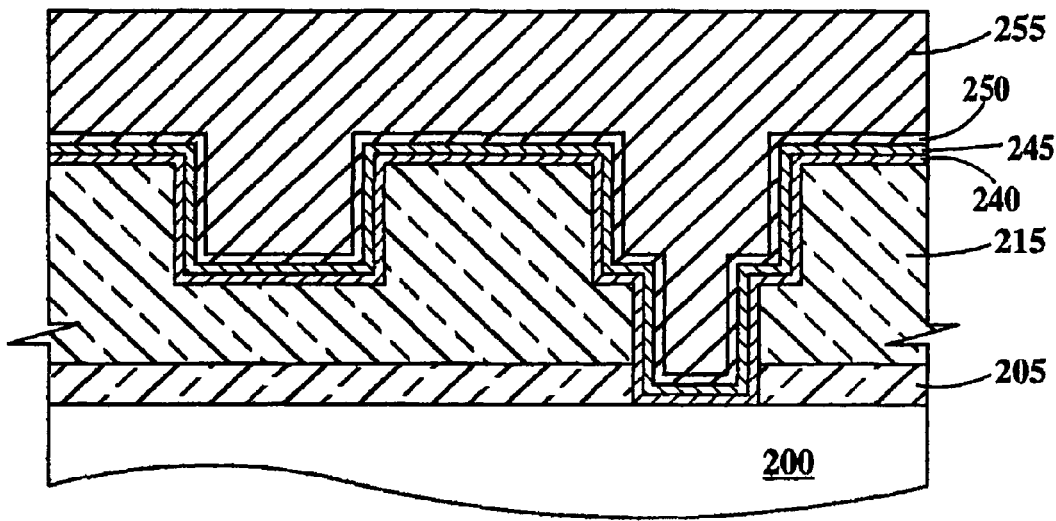

In FIG. 3D, In particular, a thick copper layer 255 is formed over all exposed surfaces of seed layer 250. In one example, Cu electroplating is performed in a three step process consisting of: 1) low current plating initiation step; 2) medium current plating gap fill step; 3) high current plating overburden step. Step 3), the high current plating overburden step, has poor gap fill, and the medium current plating step 2) must be performed for enough time to completely fill dual damascene via opening 230 (see FIG. 3C). In one example, copper layer 255 has a thickness of about 0.5 microns to about 5 microns. In one example, copper layer 155 includes less than about 10 ppm to about 500 ppm by weight of compounds of carbon, compounds of chlorine, compounds of nitrogen and compounds of sulfur, derived from additives added to the copper electroplating solution.

Figure 3E:
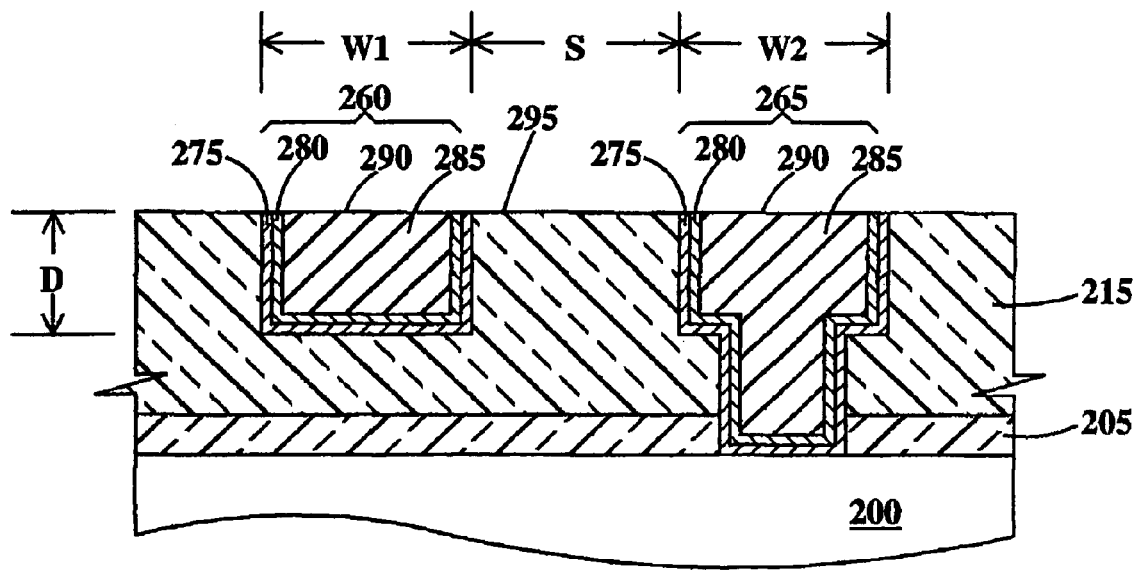

In FIG. 3E, a CMP process is performed to form dual damascene wires 260 and dual damascene wire 265 with an integral dual damascene via 270 in ILD layer 215 and integral. An example of a suitable copper CMP process utilizes an aqueous $Al_2O_3$ or $SiO_2$ abrasive slurry containing $FeNO_3$ and possibly surfactants and copper passivating agents. Dual damascene wires 260 and 265 comprise an outer liner 275, an inner liner 280 and a copper core conductor 285. Top surfaces 290 of dual damascene wires 260 and 265 are substantially coplanar with a top surface 295 of ILD layer 215. Dual damascene wire 260 had a width W1 and a thickness D. Dual damascene wire 265 had a width W2 and a thickness D. Dual damascene wire 260 and dual damascene wire 265 are separated from one another by a space S. In one example W1 is between about 0.05 microns and about 10 microns, W2 is between about 0.05 microns and about 10 microns, D is between about 0.1 microns to about 1.2 microns and S is between about 0.05 microns and about 10 microns. In a second example W1 is greater than 10 microns. In a third example W2 is greater than 10 microns.

Figure 3F:
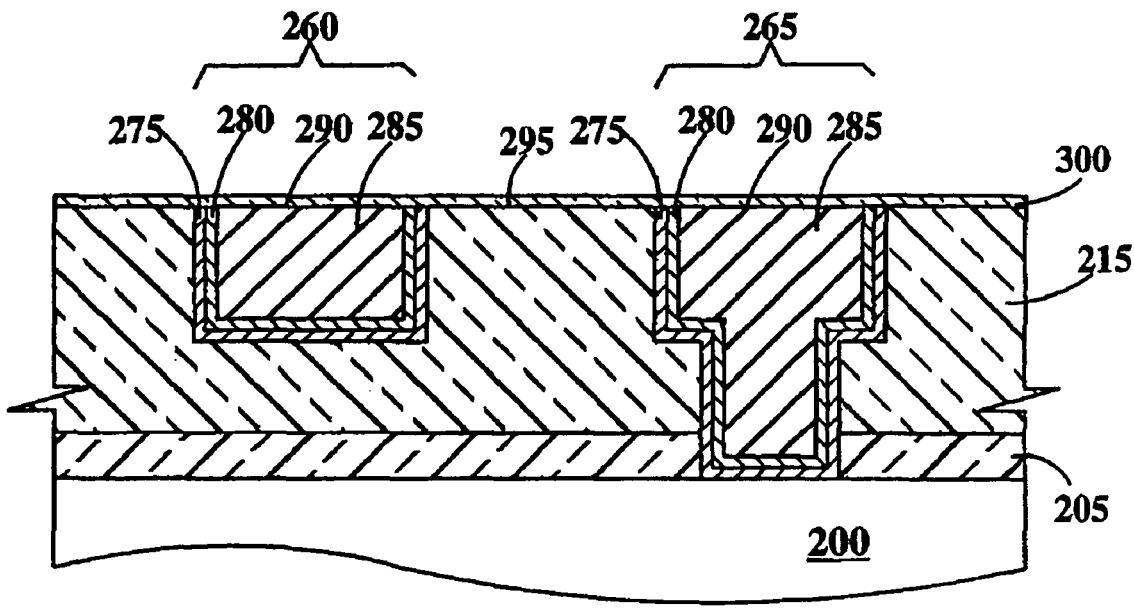

In FIG. 3F, a first capping layer 300 is deposited on all exposed surfaces of outer liner 275, inner liner 280, copper core conductor 285 and top surface 295 of ILD layer 215. Prior to deposition of first capping layer 300, a cleaning operation may be performed to increase the adhesion of first capping layer 300 to copper core conductor 285. In one example, the cleaning process includes exposing copper core conductor 285 (as well as outer liner 275, inner liner 280 and top surface 295 of ILD layer 215) to ammonia, hydrogen or other reducing plasmas. In one example, first capping layer 300 comprises $Si_xN_y$, silicon carbide ($Si_xC_y$), silicon hydrogen carbide ($SiC_xH_y$), silicon oxy-nitride car-bide ($SiC_xO_yN_z$) or silicon carbo-nitride ($SiC_xN_y$). In one example, first capping layer 300 is about 100 Å to about 300 Å thick. First capping layer 300 may be formed by high density plasma (HDP) or plasma enhanced CVD (PECVD) deposition.

In a first example, the thickness of first capping layer 300 is selected to be thin enough to allow characterization procedures such as optical microscopy and scanning electron microscopy (SEM) defect inspection and image size measurements of structures under the capping layer (i.e. thin enough to be transparent visible light and/or to back-scattered electrons in an SEM). In a second example, first capping layer 300 is thin enough to allow penetration of the capping layer by a probe tip during such characterization procedures as inline testing or parametric measurements. In all examples, first capping layer 300 is thick enough, however, to prevent formation of $Cu_xO_yF_z$ particles or Cu oxide, copper fluoride or other copper containing particles under the first capping layer. However, first capping layer 300 may not be thick enough to act as a copper diffusion barrier.

Figure 3G:
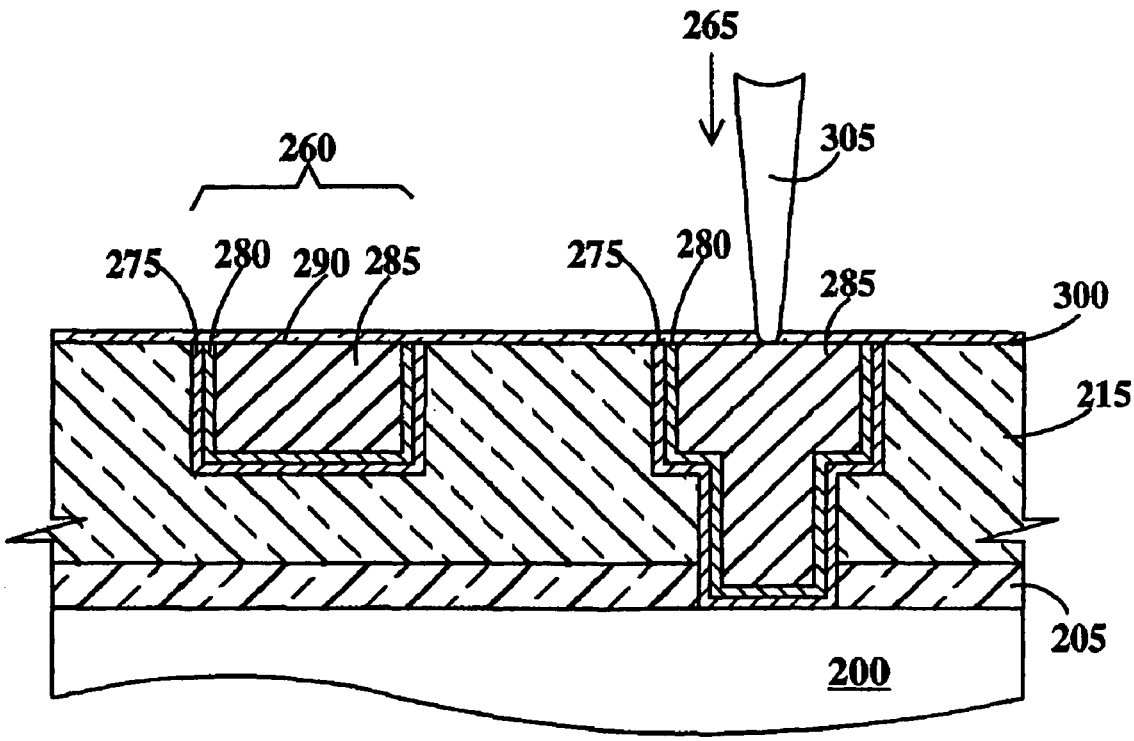

FIG. 3G, illustrates that first capping layer 300 may be thin enough to allow a conductive probe tip 305 to penetrate through the first capping layer and make electrical contact with copper core conductor 285 during an inline test operation. At this time inline testing (i.e. electrical probing) may be performed to measure parametrics of transistors and other devices and interconnect wire and via structures for process control and yield projection. Optical and SEM defect inspection, such as that conducted for optical defect inspection or for optical or SEM mage size measurements and alignment may be performed at this time. Also, mask level alignment may be measured. Because of first capping layer 300 protecting copper core conductor 285, no time limit is required, nor are the wafers required to be an oxygen or water vapor controlled atmosphere.

Figure 3H:
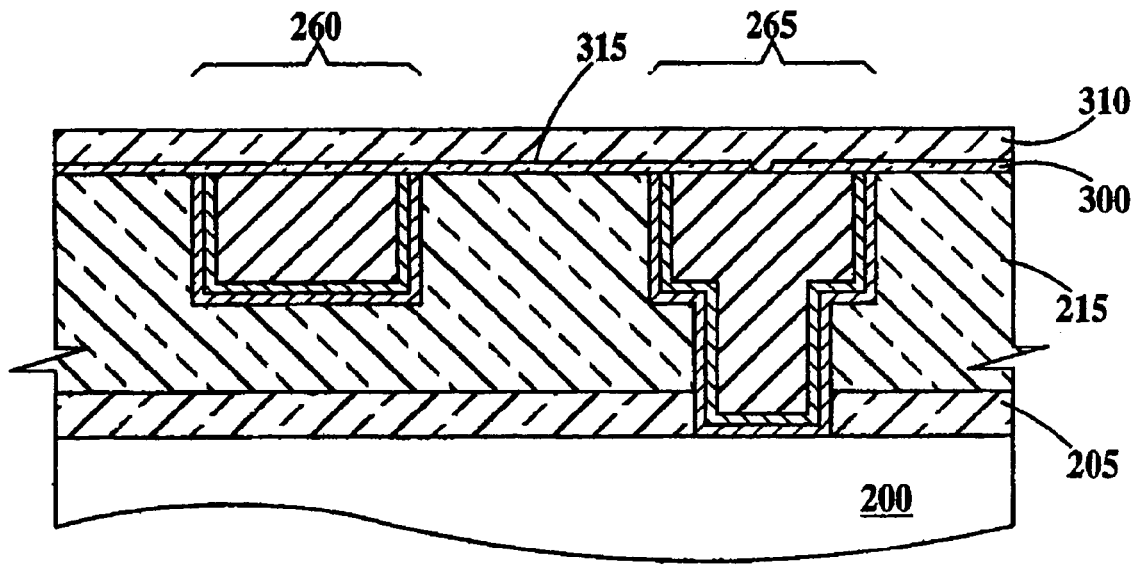

In FIG. 3H, a second capping layer 310 is deposited on a top surface 315 of first capping layer 300. Prior to deposition of second capping layer 310 a cleaning operation may be performed to remove any debris generated by inline inspection, measurement or testing. In one example, the cleaning process cryogenic cleaning operation spraying cryogenic particles of $CO_2$, Ar or $N_2$ on top surface 315 of first capping layer 300. In addition, coating incoming particles with a thin dielectric layer may improve the cleaning efficiency. In one example, second capping layer 310 comprises $Si_xN_y$, $Si_xC_y$, $SiC_xH_y$, $SiC_xO_yN_z$ or $SiC_xN_y$. In one example, second capping layer 310 is about 150 Å to about 700 Å thick. Second capping layer 310 may be formed by high density plasma (HDP) or plasma enhanced CVD (PECVD) deposition. In a first example, second capping layer 310 is formed at a temperature of about 400° C. In a second example, second capping layer 310 is formed at a temperature of between about 350° C. and about 450° C. Second capping layer 310 is thick enough either alone or in combination with first capping layer 300 to act as a copper diffusion barrier. Second capping layer 310 also acts, either alone or in combination with first capping layer 300, as an RIE stop layer for subsequently deposited ILD layer etching.

Figure 3I:
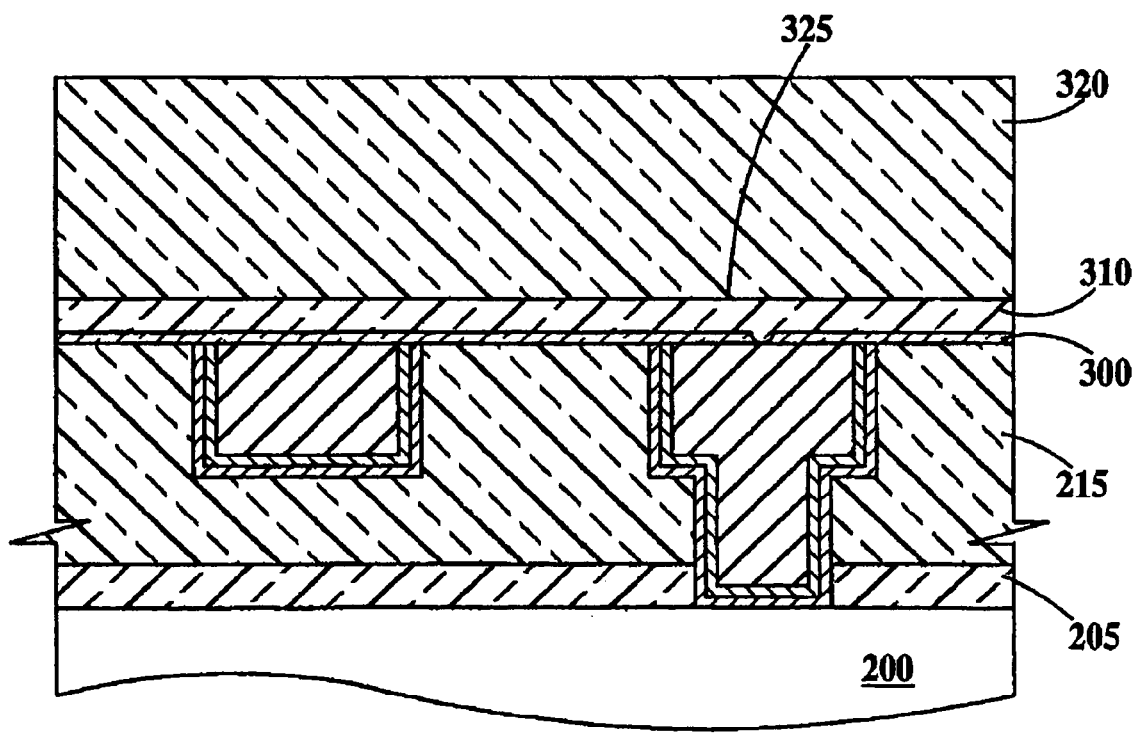

In FIG. 3I, an ILD layer 320 has been formed on a top surface 325 of second capping layer 315. An optional cryogenic clean may be performed immediately prior to formation of second capping layer 315. The steps illustrated in FIGS. 3A through 3I may be repeated as many times as required.

Figure 4A:
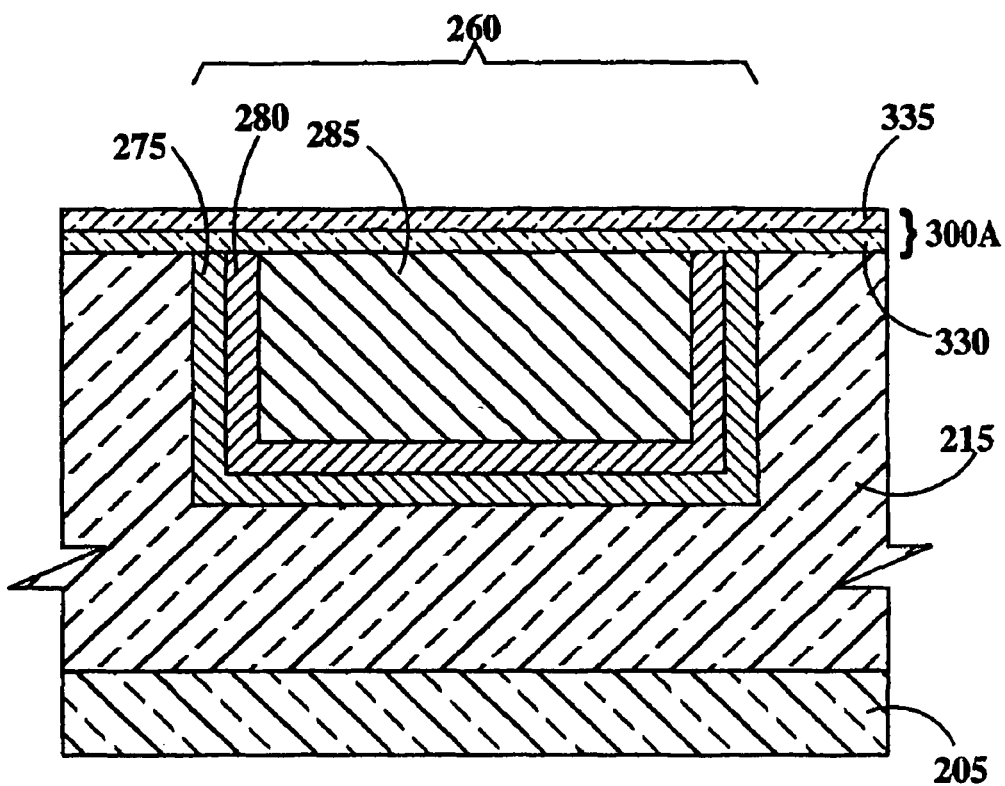
FIGS. 4A and 4B are partial cross-sectional views of a method of fabricating copper interconnect wires according to a second embodiment of the present invention.
Figure 4B:
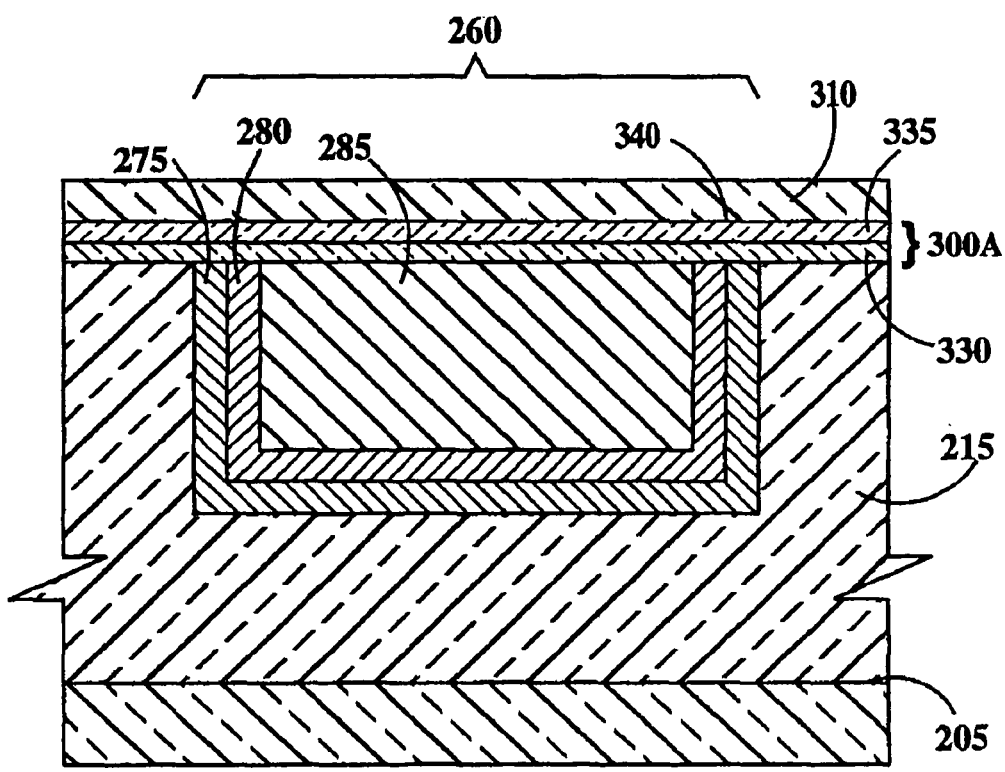

FIGS. 4A and 4B are partial cross-sectional views of a method of fabricating copper interconnect wires according to a second embodiment of the present invention. In FIG.

4A, first capping layer 300A comprises a lower first capping layer 330 and an upper first capping layer 335. In one example, lower first capping layer 330 and upper first capping layer 335 each independently comprise $Si_xN_y$, $Si_xC_y$, $SiC_xH_y$, $SiC_xO_yN_z$ or $SiC_xN_y$. In one example, lower first capping layer 330 and upper first capping layer 335 are independently about 25 Å to about 100 Å thick. All capping layers of the present invention may comprise multiple layers as discussed infra.

In a first example, the total thickness (the thickness of lower first capping layer 330 plus the thickness of upper first capping layer 335) of first capping layer 300A is selected to be thin enough to allow optical microscopy and scanning electron microscopy (SEM) defect inspection and image size measurements of dual structures under the capping layer. In a second example, first capping layer 300A is thin enough to allow penetration of the capping layer by a probe tip during inline testing or parametric characterization. In all examples, first capping layer 300A is thick enough to prevent formation of $Cu_xO_yF_z$ particles or other Cu oxides or fluoride particles under the first capping layer. First capping layer 300A may not be thick enough to act as a copper diffusion barrier.

In FIG. 4B, second capping layer 310 is formed on top surface 340 of upper first capping layer 335. Again, a cryogenic cleaning process may be performed immediately prior to formation of second capping layer 310.

In a third embodiment of the present invention first capping layer 300 and second capping layer 310 each independently comprise two or more layers of materials selected from the group consisting of $Si_xN_y$, $Si_xC_y$, $SiC_xH_y$, $SiC_xO_yN_z$ and $SiC_xN_y$, each layer of first capping layer 300 being, for example, between about 25 Å to about 100 Å thick and each layer of second capping layer 305 being, for example, between about 150 Å to about 700 Å thick.

Figure 5:
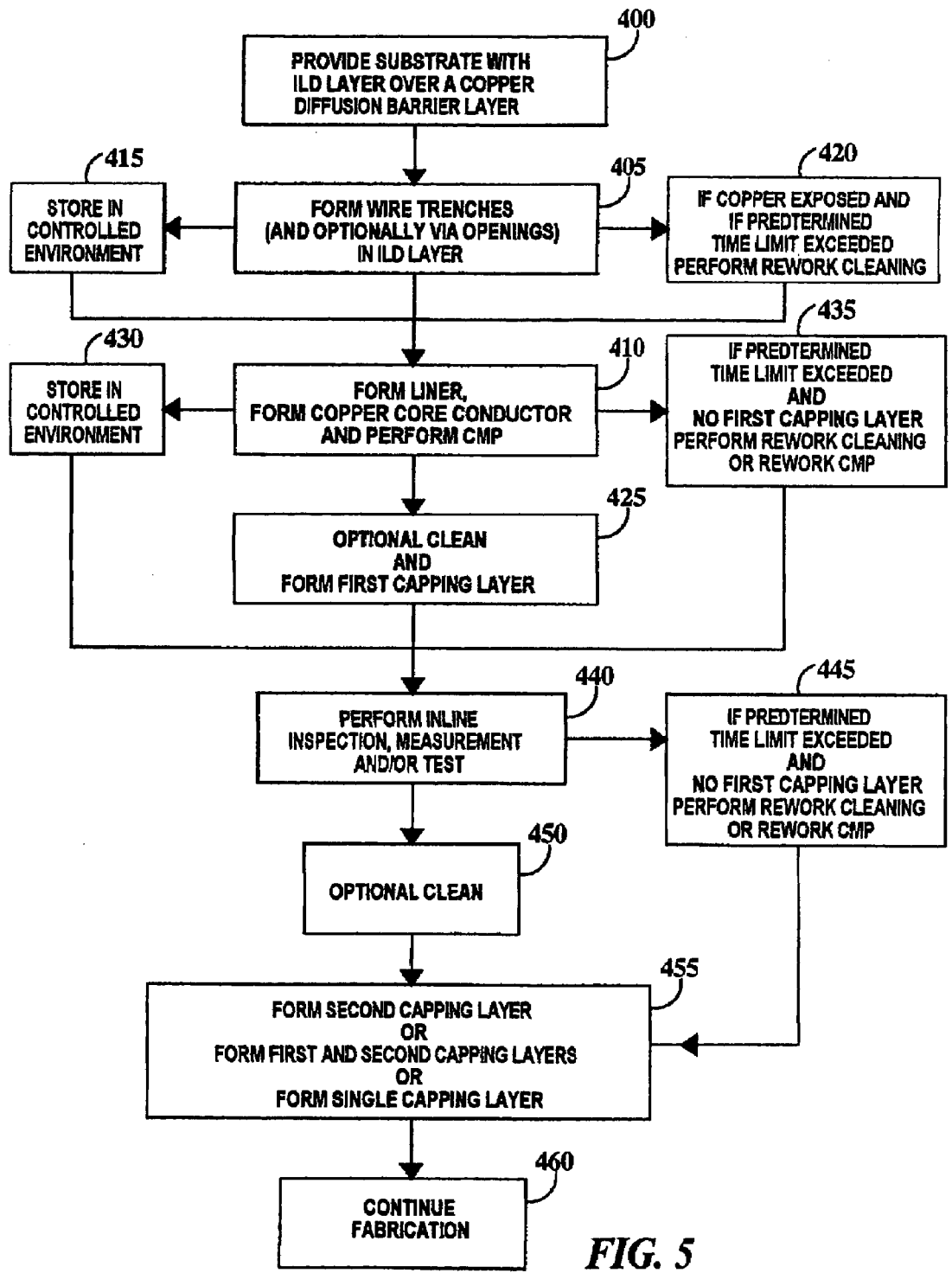
FIG. 5 is a flowchart of the method of fabricating copper interconnect wires according to the present invention.

FIG. 5 is a flowchart of the method of fabricating copper interconnect wires according to the present invention. The method may be practiced as described supra or may incorporate controlled storage and rework cleans as described infra.

In step 400, a substrate is provided with an ILD layer over a copper diffusion barrier layer as describe supra in reference to FIG. 3A. In one example, the substrate is a 200 mm or 300 mm bulk silicon or silicon-on insulator (SOI) semiconductor wafer. In step 405, wire trenches (and optionally via opening in the bottom of selected wire trenches and through the diffusion barrier layer) are formed in the ILD layer. The method can proceed three ways. The method can proceed directly to step 410 to step 415 or to step 420.

In step 410, a single or multiple layer liner is formed in the wire trenches (and in the via openings), a copper core conductor is formed and a CMP performed to form damascene (or dual damascene) wires in the ILD layer. The CMP may comprise a copper CMP step and a liner CMP step. The method can proceed three ways. The method can proceed directly to step 410 to step 415 or to step 420.

In step 415, the substrate is stored in a controlled environment until the substrate can proceed to step 410. A controlled environment may comprise a humidity-controlled environment, an inert gas environment, a temperature controlled environment or combinations thereof. An example of a humidity-controlled environment is one in which the relative humidity is less than about 20%. An example of a temperature controlled environment one in which the temperature is maintained between about 60° F. and about 80° F. An example of an inert atmosphere is one comprising $H_2$, He, Ar, $N_2$ and combinations thereof. Another example of an inert atmosphere is air with a relative humidity of about 20% or less In step 420, if a copper surface has been exposed for an amount of time greater than a predetermined period of time, then a rework cleaning step is performed. In one example, the rework cleaning step is a dip in a 100:1 (by volume) aqueous dilute HF solution. In one example, it has been experimentally determined that the predetermined amount of time is about 17 hours at about 50% relative humidity and about 70° F. Then the method proceeds to step 410.

Returning to step 410, from step 410, the method can proceed three ways. The method can proceed to directly to step 425, to step 430 or to step 435.

In step 425, and optional cleaning step, which may be a reduction process (as opposed to an oxidation process) is performed and a first capping layer is formed over the damascene (or dual damascene) wires in the FSG layer as illustrated in FIG. 3F or 4A and described supra. The first capping layer is thin enough to allow inline optical or SEM inspection and measurements as well as inline electrical probing (testing). The first capping layer is thick enough to prevent formation of $Cu_xO_yF_z$ particles. The first capping layer may not be thick enough to act as a copper diffusion barrier. The method then proceeds to step 440.

In step 440, inline inspection, measurement, testing and/or electrical probing is performed.

In step 435, if an amount of time greater than a predetermined period of time has elapsed, then a rework cleaning step is performed as described supra for step 420. Alternatively a rework liner CMP process (similar to the liner CMP step of step 410) may be performed which will polish off any Cu containing particles is performed. Then the method proceeds to step 440.

Returning to step 440, the method can proceed to step 445 or step 450. The method proceeds to step 445 only if a predetermined time limit has been exceeded and no first capping layer has been formed (step 425 was not performed) otherwise the method proceeds to step 450.

In step 450, an optional clean (which may be a cryogenic cleaning as described supra) is performed and the method proceeds to step 455.

In step 445, if an amount of time greater than a predetermined period of time has elapsed, then a rework cleaning step is performed as described supra for step 420. Alternatively a rework liner CMP process (similar to the liner CMP step of step 410) for the same or shorter amount of time may be performed which will polish off any Cu containing particles is performed. Then the method proceeds to step 455.

In step 455, either a second capping is formed on top of the first capping layer as illustrated in FIGS. 3H and 4B as described supra, or just a second capping layer is formed, or a single thicker version (same materials as described supra) of either the first or second capping layers is formed. The second capping layer is thick enough either alone or in combination with the first capping layer to act as a copper diffusion barrier. As discussed supra, each capping layer may comprise multiple layers, each layer comprising an independently selected material formed by an independently selected process.

In step 460, further steps in the fabrication of an integrated circuit are performed, including one or more repetitions of steps 405 through 455 on additional wiring levels.

The present invention provides a method of fabricating copper interconnect wiring that reduces the risk of problems related to exposed copper surface reactivity and copper containing particle formation and thus provides a method of fabricating copper interconnect wiring that reduces the risk of problems related to the diffusion of copper while still providing a cost effective manufacturable process.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, while the present invention has been described in the context of copper containing wires reacting with FSG glass to form $Cu_xO_yF_z$ particles, the present invention may be applied to preventing reactions of copper containing wires reacting with any dielectric material that forms unwanted particles such as CuF, CuO, $Cu_2O$, $Cu_2S$, CuS or other copper containing particles. Therefore, it is intended that the following claims cover all such modifications and changes as fall within the true spirit and scope of the invention.

What is claimed is:

1. A method of manufacturing an interconnect, comprising:
   (a) providing a substrate;
   (b) forming a dielectric layer on said substrate;
   (c) forming a wire in said dielectric layer, a top surface of said wire coplanar with a top surface of said dielectric layer;
   (d) forming a first capping layer on said top surface of said wire and said top surface of said dielectric layer,
   (e) pushing a conductive probe tip through said first capping layer in order to make electrical contact to said wire, and then afterwards removing said conductive probe tip from said wire and said first capping layer;
   (f) after step (e) forming a second capping layer on a top surface of said first capping layer; and between steps (e) and (f), cleaning said top surface of said first capping layer.

2. The method of claim 1, wherein said wire includes copper exposed to an ambient atmosphere at said top surface of said wire.

3. The method of claim 2, wherein said first capping layer prevents formation, on said top surface of said wire, of copper containing particles by reaction of said wire with said dielectric layer.

4. The method of claim 1, wherein said dielectric layer comprises fluorinated silicon glass.

5. The method of claim 4, wherein said dielectric layer comprises about 1% to about 9% by weight of fluorine.

6. The method of claim 4, wherein said wire includes copper exposed to an ambient atmosphere at said top surface of said wire.

7. The method of claim 6, wherein said first capping layer prevents formation, on said top surface of said wire, of copper containing particles by reaction of copper in said wire with fluorine in said dielectric layer.

8. The method of claim 1, wherein said first capping layer and said second capping layer independently include a material selected from the group consisting of $Si_xN_y$, $Si_xC_y$, $SiC_xH_y$, $SiC_xO_yN_z$ and $SiC_xN_y$.

9. The method of claim 1, wherein said first capping layer and said second capping layer each include two or more layers, each layer of said two or more layers of said first and second capping layers independently including materials selected from the group consisting of $Si_xN_y$, $Si_xC_y$, $SiC_xH_y$, $SiC_xO_yN_z$ and $SiC_xN_y$.

10. The method of claim 1, wherein said first capping layer has a thickness between about 100 Å and 300 Å.

11. The method of claim 1, wherein said second capping layer has a thickness between about 150 Å and 700 Å.

12. The method of claim 1, wherein said second capping layer is a copper diffusion barrier.

13. The method of claim 1, wherein said first capping layer in combination with said second capping layer is a copper diffusion barrier.

14. The method of claim 1, further including:
   (g) forming another dielectric layer on a top surface of said second capping layer, said second capping layer acting as a reactive ion etch stop for etching said another dielectric layer.

15. The method of claim 1, wherein forming said first capping layer comprises forming silicon nitride by high density plasma deposition and forming said second capping layer comprises forming silicon nitride formed by plasma enhanced chemical vapor deposition.

16. The method of claim 1, further including between steps and (e) (f), cryogenically cleaning said top surface of said first capping layer.

17. The method of claim 1, further including between steps (c) and (d), cleaning said top surface of said wire and said top surface of said dielectric layer in a reducing environment.

18. The method of claim 1, further including between steps (e) and (f), performing one or more characterization procedures selected from the group consisting of optical or SEM inspection and optical or SEM image size measurement.

19. The method of claim 1, wherein said first capping layer is transparent to visible light, to back-scattered electrons in a SEM or to both.

20. The method of claim 1, wherein said second capping layer is formed at a temperature of about 350° C. or greater.

21. The method of claim 1, wherein said wire comprises copper and said dielectric layer comprises fluorinated silicon glass, said first capping layer preventing formation, on said top surface of said wire, of copper oxy fluoride particles by reaction of said wire with said dielectric layer.

22. The method of claim 1, wherein said wire comprises copper and said dielectric layer comprises fluorinated silicon glass, said first capping layer preventing formation, on said top surface of said wire, of $N_xH_yF_z$ containing particles by reaction of said wire with said dielectric layer.

23. The method of claim 1, further including between steps (e)b and (f), cryogenically cleaning said top surface of said first capping layer by spraying said top surface of first capping layer with particles of $CO_2$, Ar or $N_2$.

24. The method of claim 1, wherein said first capping layer and said second capping layer independently include a material selected from the group consisting of $SiC_xH_y$, $SiC_xO_yN_z$ and $SiC_xN_y$.

25. The method of claim 1, further including between steps (c) and (d), cleaning said top surface of said wire and said top surface of said dielectric layer in reducing plasma environment.

* * * * *